United States Patent
Sung et al.

(10) Patent No.: US 10,720,357 B2
(45) Date of Patent: Jul. 21, 2020

(54) METHOD OF FORMING TRANSISTOR DEVICE HAVING FIN CUT REGIONS

(71) Applicant: Varian Semiconductor Equipment Associates, Inc., Gloucester, MA (US)

(72) Inventors: Min Gyu Sung, Essex, MA (US); Naushad K Variam, Marblehead, MA (US); Sony Varghese, Manchester, MA (US); Johannes Van Meer, Middleton, MA (US); Jae Young Lee, Bedford, MA (US); Jun Lee, Andover, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 15/909,602

(22) Filed: Mar. 1, 2018

(65) Prior Publication Data
US 2019/0273011 A1 Sep. 5, 2019

(51) Int. Cl.
| | |
|---|---|
| H01L 21/762 | (2006.01) |
| H01L 21/02 | (2006.01) |
| H01L 21/265 | (2006.01) |
| H01J 37/32 | (2006.01) |
| H01L 29/66 | (2006.01) |

(52) U.S. Cl.
CPC ......... *H01L 21/762* (2013.01); *H01J 37/32* (2013.01); *H01L 21/02236* (2013.01); *H01L 21/02238* (2013.01); *H01L 21/02252* (2013.01); *H01L 21/26533* (2013.01); *H01L 21/26586* (2013.01); *H01L 29/66795* (2013.01)

(58) Field of Classification Search
None
See application file for complete search history.

(56) References Cited

U.S. PATENT DOCUMENTS

| | | | | |
|---|---|---|---|---|
| 5,702,989 A | * | 12/1997 | Wang | H01L 27/10817 257/E21.008 |
| 5,918,151 A | * | 6/1999 | Tachimori | H01L 21/26533 438/766 |
| 6,362,040 B1 | * | 3/2002 | Tews | H01L 21/02238 257/E21.285 |
| 2004/0097058 A1 | * | 5/2004 | Purser | H01J 37/14 438/514 |
| 2017/0236722 A1 | * | 8/2017 | Fan | H01L 29/0657 257/623 |

* cited by examiner

*Primary Examiner* — Anthony Ho
*Assistant Examiner* — Kevin Quinto

(57) ABSTRACT

A method of forming a semiconductor device. The method may include providing a device structure, where the device structure comprises a masked portion and a cut portion. The masked portion may comprise a mask covering at least one semiconductor fin of a fin array, and the cut portion may comprise a trench, where the trench exposes a semiconductor fin region of the fin array. The method may further include providing an exposure of the trench to oxidizing ions, the oxidizing ions to transform a semiconductor material into an oxide.

13 Claims, 7 Drawing Sheets

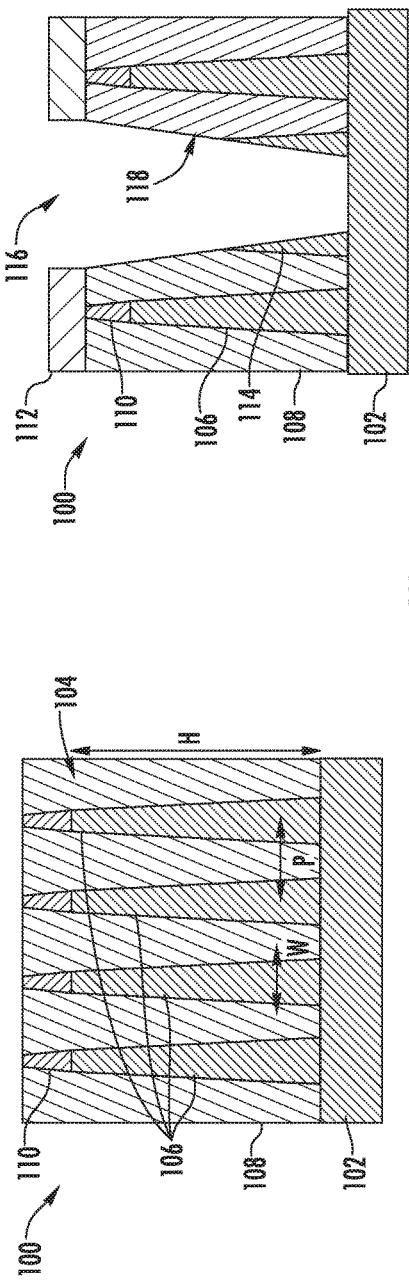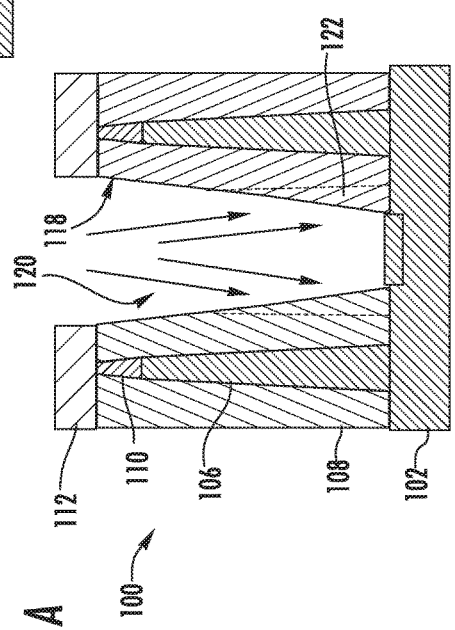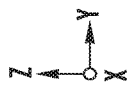

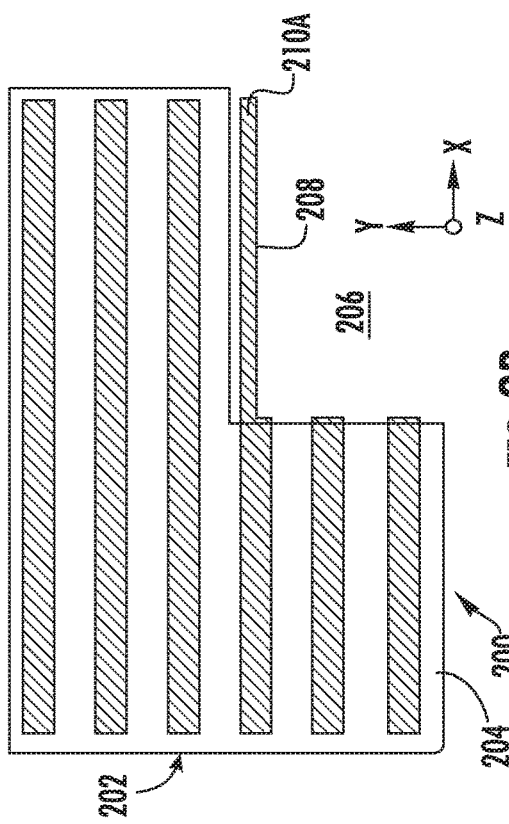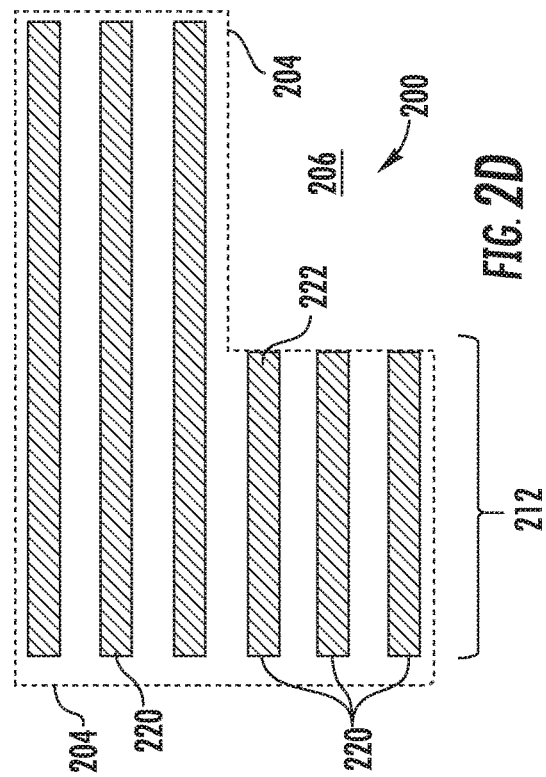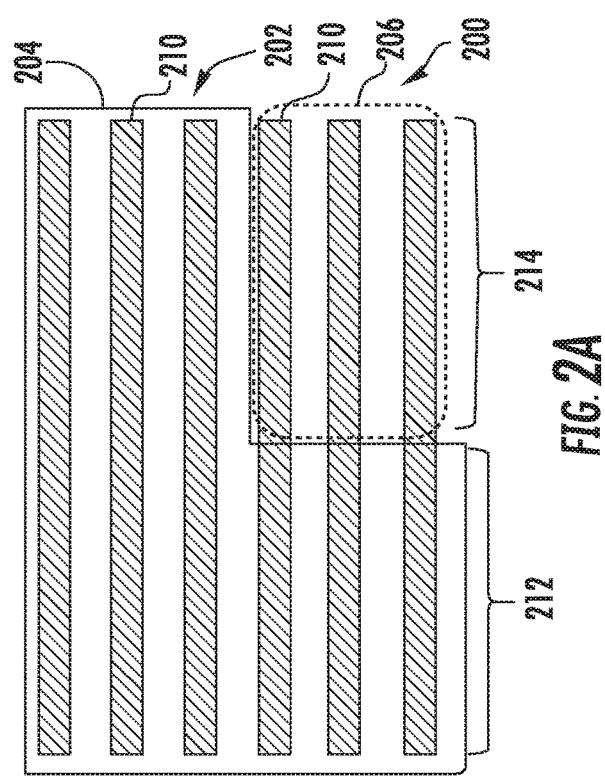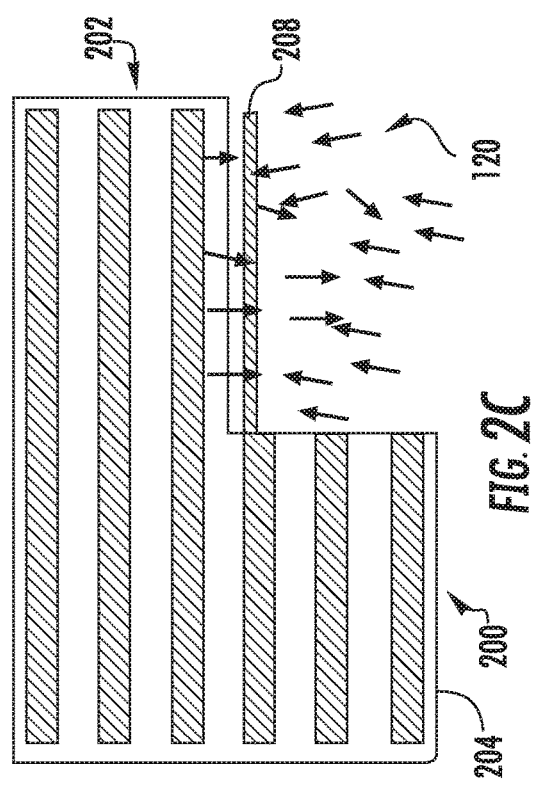

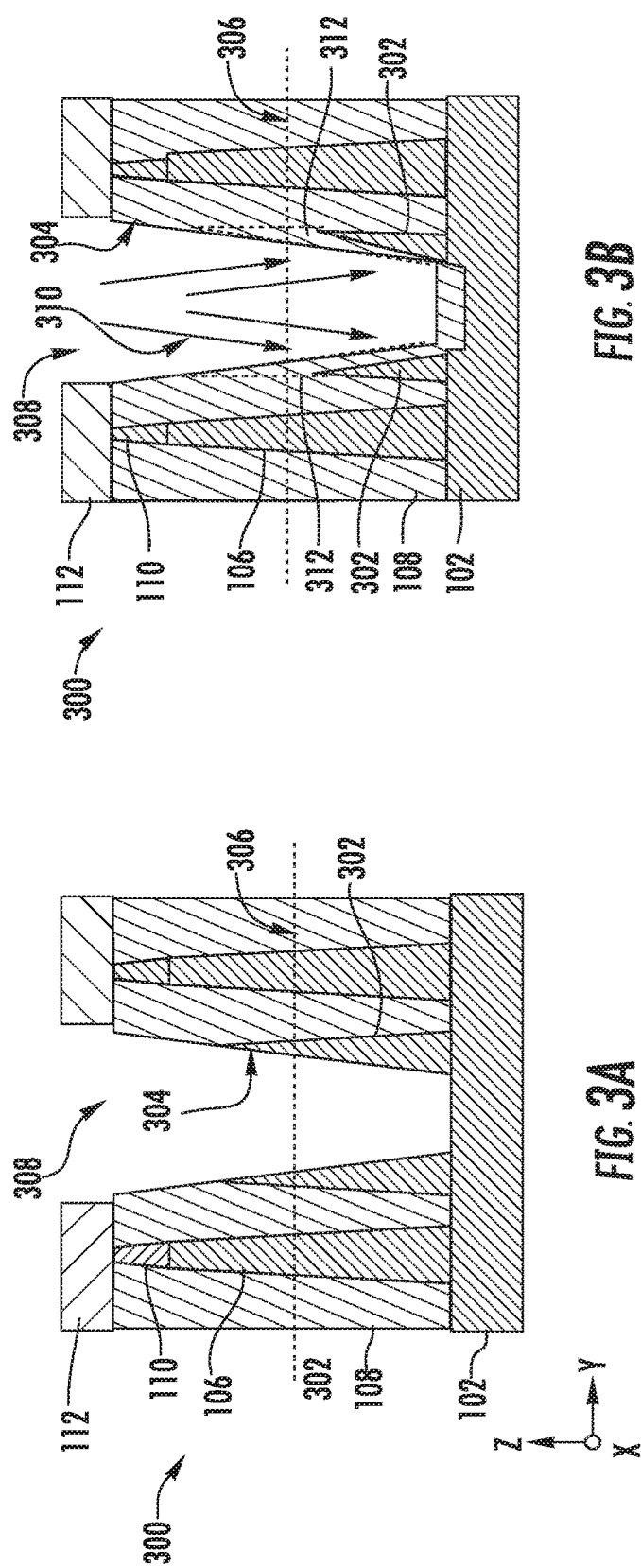
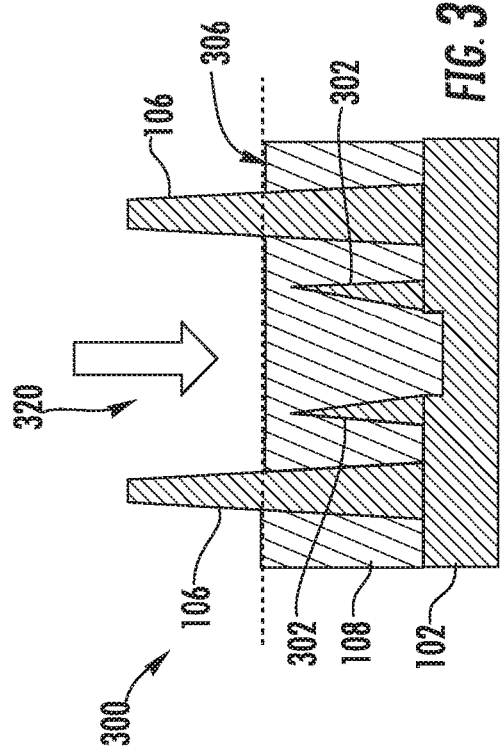
FIG. 3A
FIG. 3B
FIG. 3C

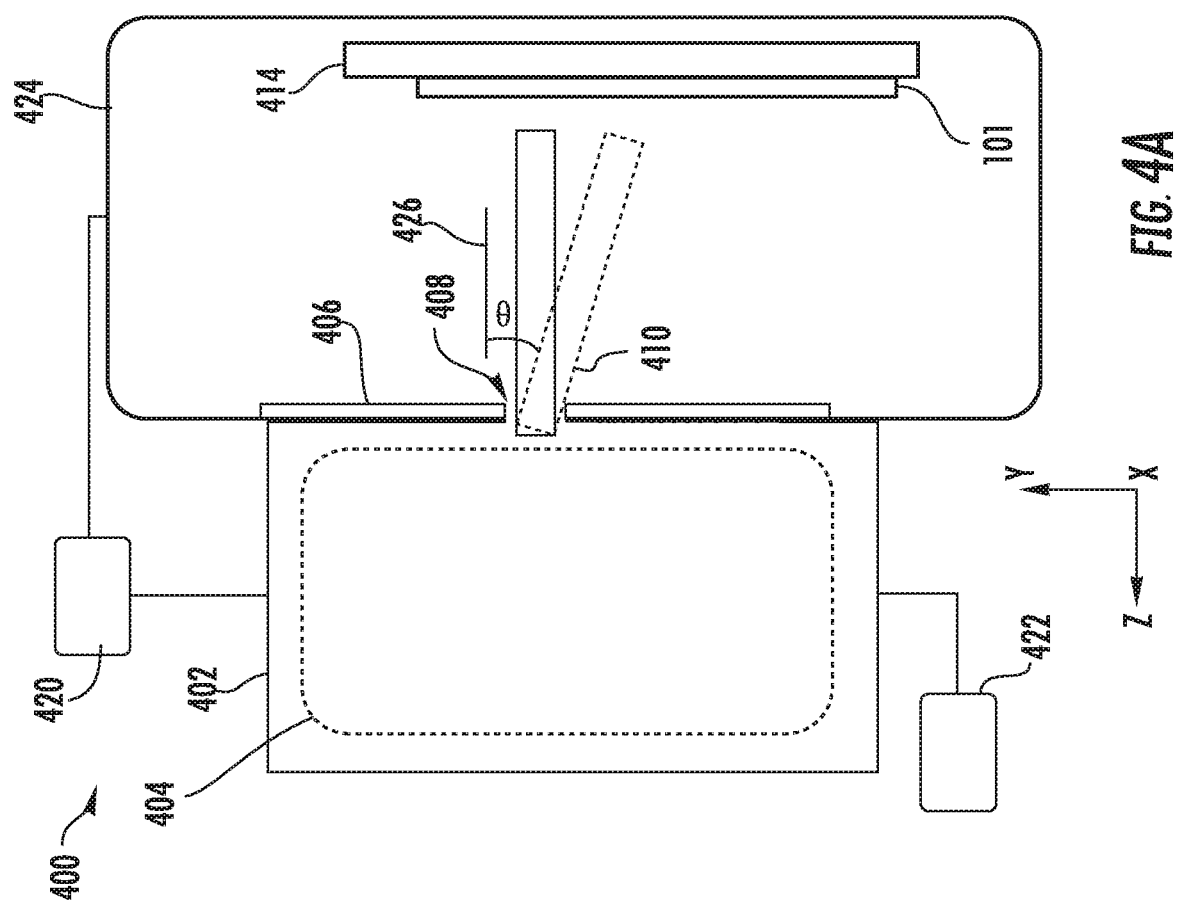
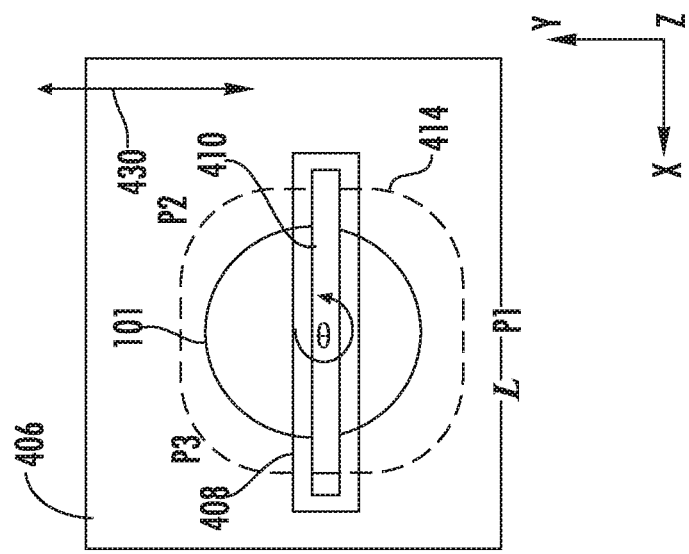
FIG. 4A
FIG. 4B

```
┌─────────────────────────────────────────┐
│ GENERATE FIN ARRAY ON SUBSTRATE, FIN ARRAY │
│ COMPRISING PLURALITY OF SEMICONDUCTOR FINS │
│                  702                      │
└─────────────────────────────────────────┘
                    │
                    ▼
┌─────────────────────────────────────────┐
│  FORM STI ISOLATION BETWEEN SEMICONDUCTOR FINS │
│              OF FIN ARRAY                 │
│                  704                      │
└─────────────────────────────────────────┘
                    │
                    ▼
┌─────────────────────────────────────────┐
│   PERFORM ANISOTROPIC REACTIVE ION ETCHING TO │
│    GENERATE FIN CUT REGION IN THE FIN ARRAY │
│                  706                      │
└─────────────────────────────────────────┘
                    │
                    ▼
┌─────────────────────────────────────────┐
│    EXPOSE FIN CUT REGION TO OXIDIZING IONS USING │
│       ROOM TEMPERATURE PLASMA OXIDATION   │
│                  708                      │
└─────────────────────────────────────────┘
                    │
                    ▼
┌─────────────────────────────────────────┐
│     DEPOSIT STI ISOLATION MATERIAL IN FIN CUT REGION │
│                  710                      │
└─────────────────────────────────────────┘
                    │
                    ▼
┌─────────────────────────────────────────┐
│      PERFORM FIN REVEAL ETCH TO EXPOSE ACTIVE FIN │
│                 PORTIONS                  │
│                  712                      │
└─────────────────────────────────────────┘
                    │
                    ▼
                ( END )        700
```

FIG. 7

METHOD OF FORMING TRANSISTOR DEVICE HAVING FIN CUT REGIONS

FIELD

The present embodiments relate to semiconductor device structures, and more particularly, to structures and processing for transistor devices.

BACKGROUND

As semiconductor devices scale to smaller dimensions, the ability to harness device improvements with decreased size becomes more challenging. The synthesis of three-dimensional semiconductor transistors, such as fin type field effect transistors (finFET), involves challenging processing issues. In many finFET designs, an array of fins may be formed, wherein at least a portion of this array of fins is to be removed during device fabrication. So-called fin cutting processes may employ masks to protect fins not to be removed, while creating fin cut regions to expose other fins to be removed. Because of overlay and etching issues, the fins targeted for removal may be incompletely etched using known anisotropic etching processes, leaving fin remnants such as so-called fin spikes, where the fin spikes may protrude above the surface of isolation oxide. Notably, the fin spikes, being formed of semiconductor material such as silicon, may be removed using isotropic etching. This approach carries the unwanted side-effect of etching silicon fins in a lateral direction, so the length of the fins may be unduly reduced.

With respect to these and other considerations, the present disclosure is provided.

BRIEF SUMMARY

In one embodiment, a method for forming a semiconductor device is provided. The method may include providing a device structure, where the device structure comprises a masked portion and a cut portion. The masked portion may include a mask covering at least one semiconductor fin of a fin array. The cut portion may include a trench, where the trench exposes a semiconductor fin region of the fin array. The method may further include providing an exposure of the trench to oxidizing ions, where the oxidizing ions are to transform a semiconductor material within the trench into an oxide.

In another embodiment, a method for forming a finFET device may include providing a fin array on a substrate, the fin array comprising a plurality of semiconductor fins, wherein the semiconductor fins are separated by an isolation oxide. The method may further include performing a fin cut operation on the fin array, wherein a trench is formed in the fin array, the trench including at least a portion of at least one fin of the fin array; and providing an exposure of the trench to oxidizing ions, wherein at least a first part of the semiconductor fin in the trench is oxidized.

According to a further embodiment, a method for forming a finFET device may include providing a fin array on a substrate, the fin array comprising a plurality of tapered semiconductor fins, wherein the tapered semiconductor fins are separated by an isolation oxide. The method may include forming a mask on the fin array, where the mask defines a fin cut region. The method may also include etching the fin array while the mask is in place to form a trench in the fin array in the fin cut region, wherein the trench extends from a surface of the mask to a bottom of the semiconductor fins. The method may also include performing a plasma oxidation of the fin array while the mask is in place, wherein oxidizing ions are implanted into the trench.

BRIEF DESCRIPTION OF THE DRAWINGS

FIG. 1A-1C depict a side cross-sectional view of a device structure, at various stages of fabrication, according to embodiments of the disclosure;

FIGS. 2A-2D shows a to plan view of a device structure, at different stages of fabrication, according to embodiments of the disclosure;

FIGS. 3A-3C depict a side cross-sectional view of a device structure, at various stages of fabrication, according to embodiments of the disclosure;

FIGS. 4A and 4B show a processing apparatus, according to further embodiments of the disclosure;

FIG. 7 shows a process flow, according to further embodiments of the disclosure.

DETAILED DESCRIPTION

Figure 5A:
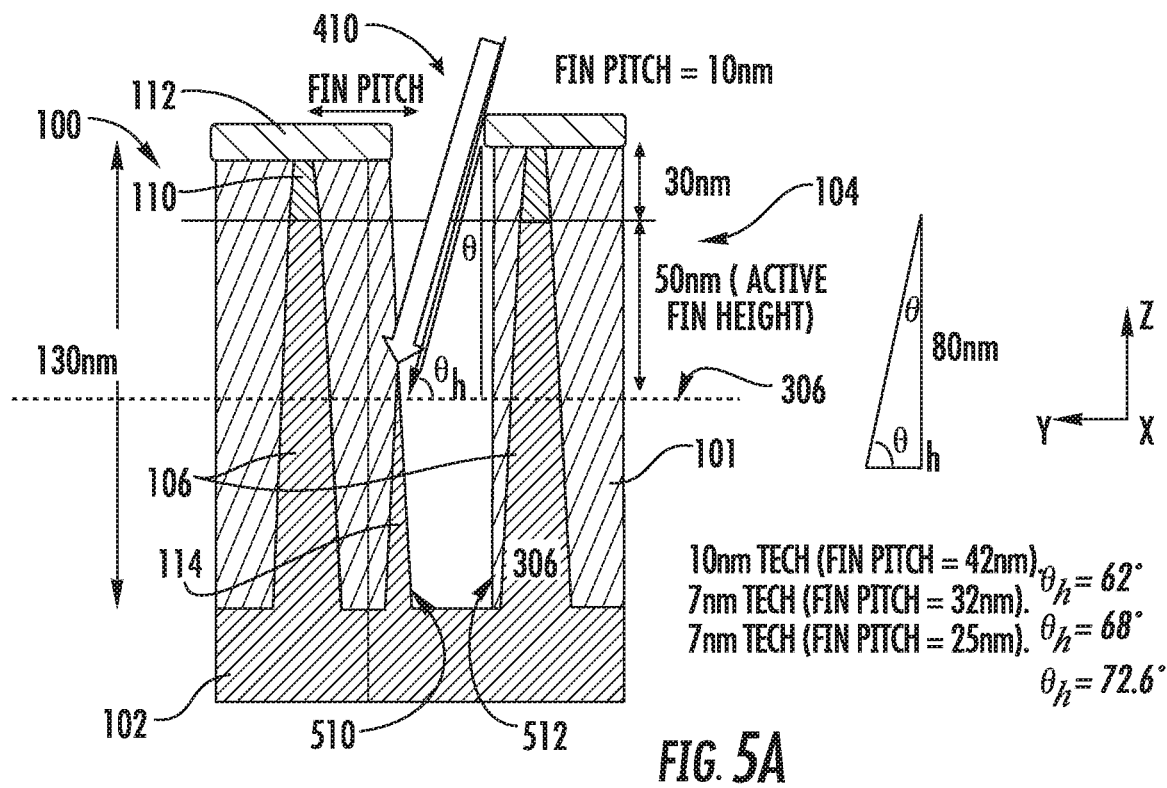
FIGS. 5A and 5B show details of anisotropic oxidation, according to further embodiments of the disclosure.

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The present embodiments provide novel techniques and substrate structures to form devices, including three dimensional transistors, formed in a semiconductor substrate. As is known, three dimensional transistors, such as finFETs, may be arranged in circuitry to form various types of logic devices, as well as memory devices.

Turning now to FIG. 1A to FIG. 1C there is shown a device structure 100 at various stages of fabrication, according to embodiments of the disclosure. The device structure 100 is shown in side cross-sectional view as represented by the Z-Y plane of the Cartesian coordinate system shown.

In FIG. 1A, the device structure 100 is shown at one stage of fabrication, where a fin array 104 is provided on a substrate, where the substrate may include a substrate base 102. As in known finFET devices, the fin array 104 may be formed of monocrystalline semiconductor material, such as silicon or a silicon:germanium alloy (SiGe). The embodiments are not limited in this context. The fin array 104 may be integrally formed from the substrate base 102 as in known devices. In some embodiments, a substrate may include other portions or the substrate may be formed generally from the substrate base 102, which base may be a monocrystalline semiconductor. The fin array 104 includes a plurality of semiconductor fins, shown as semiconductor fins 106. In some examples, the semiconductor fins 106 may be formed having a pitch P between adjacent semiconductor fins. In particular embodiments, the pitch P may be less than 100 nm, and in some cases, less than 30 nm. As such, the fin width W of the semiconductor fins 106 may also be less than 30 nm in some embodiments, since the fin width W is less than the pitch P. For tapered semiconductor fins, the terms "fin width" or "fin width W" may refer to an average width of the fin. According to various embodiments, the height H of semiconductor fins 106 may range between 50 nm and 150 nm. The embodiments are not limited in this context. As such, the aspect ratio of the semiconductor fins 106, meaning H/W, may in some cases exceed 10, and in particular cases may be 20 or greater. As further shown in FIG. 1A, the semiconductor fins 106 may be tapered semiconductor fins, where the fin width W decreases with increasing distance above the substrate base 102. The taper angle with respect to perpendicular to the plane of the substrate, meaning with respect to the Z-axis, may be 1 degree, 3 degrees, 5 degrees, or 7 degrees in some non-limiting embodiments.

At the stage of fabrication shown in FIG. 1A, a so-called shallow trench isolation material, or STI, has been formed between semiconductor fins, as represented by the insulator 108. A cap layer 110, such as silicon nitride, is disposed on the semiconductor fins 106. To form finFET devices and circuits, various designs may call for fin cut operations, to remove portions of the fin array, including whole semiconductor fins, or parts of semiconductor fins, as in known technology. According to the present embodiments, a novel combination of etching and oxidation operations may be employed to improve the final structure of such a finFET, as outlined in FIG. 1B and FIG. 1C.

Turning now to FIG. 1B, there is shown the device structure 100 after the performance of a fin cut operation, according to some embodiments. The fin cut operation may employ more than one operation, such as anisotropic reactive ion etching, to remove material from the fin array 104, forming the trench 116, as shown. A mask 112 may be formed to define the region of trench 116, according to known techniques. In some embodiments, the mask 112 may be photoresist, deposited and patterned according to known lithographic procedures. The mask 112 may define at least one opening where a trench 116 is to be formed. The formation of the trench 116 may be accomplished using anisotropic reactive ion etching (RIE) to remove insulator 108, such as oxide, as well as to remove semiconductor fins within the region of the opening of the mask 112. The fin cut operation may be designed to remove a certain number of semiconductor fins 106, or at least a part of semiconductor fins 106. In an ideal operation, the anisotropic RIE operation may be designed to yield vertical sidewalls for the trench 116. In this manner, be proper placement of openings in the mask 112 with respect to the fin array 104, the appropriate semiconductor fins 106 may be removed in the fin cut operation. Notably, in the example of FIG. 1B, as in known RIE processing, the angle of sidewall 118 of trench 116 is not vertical, and may form an angle of several degrees or more with respect to the perpendicular (Z-Axis) to the plane of the substrate (X-Y) plane. Because of a combination of overlay error in placement of openings in the mask 112, as well as non-ideal etching during the fin cut operation, portions of semiconductor fins 106 in the trench 116 may be incompletely removed, as shown in FIG. 1B. These portions are shown as fin remnants 114.

Turning now to FIG. 1C, there is shown a subsequent operation where an exposure of the trench 116 to oxidizing ions 120 is provided. According to various embodiments, the oxidizing ions 120 may be oxygen ions, such as $O^+$ or $O_2^+$ ions. As such, at least a portion of semiconductor fins 106 within the trench 116 are oxidized.

In various embodiments, the operation of FIG. 1C may be provided in a known plasma system, such as a plasma doping (PLAD) tool, where the substrate containing the device structure 100 is placed in a plasma chamber while a bias is applied to bias the substrate with respect to the plasma, to impart a targeted ion energy into the oxidizing ions 120. According to some embodiments, the oxidizing ions may have an ion energy of 500 eV to 10 keV. At this range of ion energies, the oxidizing ions 120 may implant into the fin remnants 114 to a depth of approximately 1 nm to several nanometers. For fin remnants 114 having a width along the Y-axis not exceeding 2 nm-10 nm, for example, the oxidizing ions 120 may implant to a depth, wherein a portion or all of the fin remnant 114 is oxidized. According to some embodiments, a PLAD oxidation process involving the oxidizing ions 120 may be carried out at room temperature (RT), while the duration of the PLAD oxidation may be arranged to provide sufficient number of oxidizing ions (such as oxygen) to change the character of the fin remnant 114 from semiconductor to insulator. For example, the PLAD oxidation may transform silicon fin remnants into silicon oxide, at least to the implant depth of the implanting oxidizing ions. As suggested in FIG. 1C, for example, the fin remnants 114 may in some cases be completely transformed into insulator material, such as silicon oxide, in the fin remnant regions 122.

As discussed further below, because of the oxidation of the fin remnants 114, semiconductor material may be removed from the trench 116, as originally intended during a fin cut operation.

Turning to FIG. 2A, FIG. 2B, FIG. 2C, and FIG. 2D, there is shown a device structure 200 at various stages of fabrication, in top plan view. The device structure 200 includes a fin array 202, where the fin array is initially arranged as a plurality of semiconductor fins, shown as semiconductor fins 210. For purposes of illustration the semiconductor fins are shown having the same length along the X-axis, i.e., the long direction of the semiconductor fins 210. To fabricate a device having a designed arrangement of semiconductor fins, a fin cut operation or set of operations may be performed to remove a section of at least one of the semiconductor fins 210, or an entirety of a semiconductor fin(s) 210. To accomplish a fin cut operation, FIG. 2A illustrates the formation of a mask 204, having an L-shape, where a cut region 206 is exposed, so the portion of semiconductor fins 210 in the cut region 206 are not covered by the mask 204. As shown, the mask 204 is arranged to cover a first segment 212 of three of the semiconductor fins 210, and to expose a second segment 214 of three of the semiconductor fins 210. In this arrangement, the appropriate etching may be performed to remove the second segment 214 of the semiconductor fins 210, extending into the cut region 206.

Turning to FIG. 2B there is shown a subsequent instance after a fin cut operation is performed, removing portions of semiconductor fins 210 (as well as insulator, see FIG. 1B) in the cut region 206. As shown in FIG. 2B, for some of the semiconductor fins 210, the second segment 214 has been removed completely, while for semiconductor fin 210A, a fin remnant 208 of the semiconductor fin 210A remains in the cut region 206. The fin remnant 208 may result from mask overlay error for the mask 204, as well as etching profile, where a trench formed in the cut region 206 has non-vertical sidewalls, as shown in the example of FIG. 1B. Turning to FIG. 2C, there is a subsequent instance shown where oxidizing ions 120 are directed to the device structure 200, with mask 204 in place. For clarity, the oxidizing ions 120 are illustrated just in the cut region 206, while the oxidizing ions 120 may actually impinge over the whole substrate of the device structure 200. As such, the oxidizing ions 120 may implant into any regions of device structure 200, including into fin remnant 208. The projection of trajectories of oxidizing ions 120 within the X-Y plane is shown in schematic form, while the trajectories may be aligned closer to the Z-axis, as shown in the side cross-sectional views of FIG. 1C. In a PLAD plasma, for example, the trajectories of oxidizing ions 120 may be somewhat angled with respect to the Z-axis, as illustrated in FIG. 1C, where the fin remnant 208 may present a surface, where the surface is also angled, forming a non-zero angle with respect to the Z-axis. As such, the oxidizing ions 120 may implant into the fin remnant 208, albeit not necessarily at a normal incidence with respect to the surface of the fin remnant (see FIG. 1B for sidewall 118). In the case where fin remnant 208 is silicon or similar semiconductor material, and the oxidizing ions 120 are oxygen species, the fin remnant 208 may be oxidized, transforming into an $SiO_2$ material, or $SiO_X$ material having insulator properties. Thus, the oxidizing ions 120 may provide an anisotropic implant where the trajectories of ions are closer to vertical (parallel to Z-axis) than to horizontal (parallel to X-Y plane), and may also implant into the angled surfaces presented by fin remnants, such as fin remnant 208.

Turning to FIG. 2D, there is shown a later instance after the exposure to oxidizing ions 120 is completed. At this stage, the mask 204 may also be removed, where the position of the mask 204 is indicated by the dashed lines for reference. As shown in the top plan view, the cut region 206 no longer presents any semiconductor fins 210 or portions of the semiconductor fins 210. Notably, as illustrated in FIG. 1C, the material of the fin remnant 208 shown in FIGS. 2B-2C may not actually be absent at the stage of FIG. 2D. More precisely, the fin remnant 208 has been transformed into an insulator, such as oxide. Thus, the blank area shown in the cut region 206 of FIG. 2D may represent oxide material, formed at the bottom of a trench, as well as along the sidewall of the trench. As such, the arrangement of FIG. 2D represents the ideal targeted structure for the fin cut operation of FIG. 2B, where non-ideal masking and etching in the actual fin cut operation lead initially to the formation of a fin remnant 208.

One notable feature of the device structure 200 at FIG. 2D is the size of the truncated fins 220, where the length of the truncated fins 220 along the Z-axis corresponds to the first segment 212, covered by the mask 204, shown in FIG. 2A. Because the oxidizing implantation performed by oxidizing ions 120 is anisotropic, the mask 204 is useful to screen out oxidizing ions from implanting into the first segment 212. Thus, portions of semiconductor fins 210 disposed in the position of the first segment 212 are not implanted by oxidizing species and are not oxidized. Accordingly, the truncated fins 220 retain the designed fin length, i.e., the length of the first segment 212. As noted, known isotropic RIE techniques may be used to etch and remove fin remnants, alternatively to the oxidizing implant procedures of the present embodiments. In the isotropic RIE techniques, etching of semiconductor material proceeds in all directions, wherein the ends of truncated semiconductor fins may be etched. This attack may produce fin loss in regions, shown schematically in FIG. 2D as loss regions 222, making control of fin length difficult using known isotropic RIE approaches to remove remnants of fin cut operations.

Turning now to FIG. 3A to FIG. 3C there is shown a device structure 300 at different stages of fabrication, according to further embodiments of the disclosure. The device structure 300 is shown in side cross-sectional view as represented by the Z-Y plane of the Cartesian coordinate system shown.

The device structure 300 may be substantially similar to the device structure 100, and may be fabricated similarly to the device structure 100, particularly with respect to FIGS. 1B and 1C. In FIG. 3A, the device structure 300 is shown at one stage of fabrication, after the performance of a fin cut operation, according to some embodiments. The fin cut operation may employ more proceed generally as described above with respect to FIG. 1B. In an ideal operation, the anisotropic RIE operation may be designed to yield vertical sidewalls for the trench 308. Notably, in the example of FIG. 3A, as in known RIE processing, the angle of sidewall 304 of trench 308 is not vertical, and may form an angle of several degrees or more with respect to the perpendicular (Z-Axis) to the plane of the substrate (X-Y) plane. Because of a combination of overlay error in placement of openings in the mask 112, as well as non-ideal etching during the fin cut operation, portions of semiconductor fins 106 in the trench 308 may be incompletely removed, as shown in FIG. 3A. These portions are shown as fin remnants 302. The fin remnants 302 may be similar to fin remnants 114. For purposes of illustration, the fin remnants 302 are shown as larger than fin remnants 114, meaning less fin removal in the trench 308 has taken place as compared to the scenario of FIG. 1B. As such, the fin remnants 302 extend above an isolation level 306, shown as a dashed line. The isolation level 306 may represent the level to which STI insulator is to be filled to electrically isolate semiconductor fins in a final device structure. Said differently, the isolation level 306 represents the level delineating the bottom of active fin portions of a finFET. Because the fin remnants 302 extend above the isolation level, the fin remnants 302 may present a source of defects or device degradation.

Turning now to FIG. 3B, there is shown a subsequent operation where an exposure of the trench 116 to oxidizing ions 310 is provided. According to various embodiments, the oxidizing ions 310 may be oxygen ions, such as $O^+$ or $O_2^+$ ions. As such, at least a portion of semiconductor fins, meaning the fin remnants 302, within the trench 308, are oxidized. Depending upon the ion energy of the oxidizing ions 310, the ion flux, and other factors, the fin remnants 302 may be completely oxidized or just portions of the fin remnants 302 may be oxidized. In the example of FIG. 3B, just a portion 312 (shown in the dashed area) of the fin remnants 302 is oxidized, reducing the height of the fin remnants 302, so the fin remnants 302 now do not extend to the isolation level 306.

Notably, in this embodiment and other embodiments, because any fin remnants, such as fin remnants 302, may have the cross-sectional shape of pointed triangles or spikes, the transformation of fin material in top portions of the fin remnants may be readily accomplished by directing ions at a known energy and ion dose to oxidize a given thickness of silicon or SiGe, which thickness may be on the order of just 1 nm to 3 nm in some cases. For example, an ion dose of $5E15/cm^2$ to $1E16/cm^2$ may create an oxide layer in the range of a few to several nanometers. Depending on process parameters, 30 seconds to 1 minute may be spent to implant a dose of $1E16/cm^2$. Thus, ion dose and ion energy of implanting ions in a plasma oxidation process may be chosen to oxidize just a particular amount of a semiconductor layer, if present in the trench. Because the dose entailed for forming a 1 nm to 3 nm oxide layer may take on the order of 1 minute to implant, control of the exact amount of oxide layer to be formed is highly controllable, where oxide layer thickness formed by implantation may be adjusted to the sub-nanometer level.

Turning to FIG. 3C, there is shown a subsequent stage after an STI fill and fin reveal processes are performed, where insulator is deposited and etched using etchant 320 to present active fin regions of the semiconductor fins 106, above the isolation level 306. In this case, the smaller size of the fin remnants 302 allows the fin remnants to extend innocuously below the isolation level 306 within the insulator 108.

While the aforementioned embodiments may be implemented using semiconductor fins formed of silicon, in other embodiments, semiconductor fins may be formed of SiGe material, or a composite structure, such as a lower portion formed of silicon and an upper portion formed of SiGe. Notably, for fin remnants where at least a part of the fin remnant includes SiGe, the SiGe material may be readily oxidized by the aforementioned oxidizing ions, wherein the size of the fin remnants may be reduced or eliminated as needed.

In further embodiments of the disclosure, an oxidizing ion beam may be used to oxidize fin remnants. Turning now to FIG. 4A, there is shown a processing apparatus 400, depicted in schematic form. The processing apparatus 400 represents a processing apparatus for performing anisotropic oxidation of a substrate, such as oxidizing fins or fin remnants. The processing apparatus 400 may be a plasma based processing system having a plasma chamber 402 for generating a plasma 404 therein by any convenient method as known in the art. An extraction plate 406 may be provided as shown, having an extraction aperture 408, where an oxidizing ion beam 410 may be extracted to directing oxidizing ions to a substrate 101. The substrate 101, including, for example, the aforementioned substrate base 102 and fin array 104, is disposed in the process chamber 424. A substrate plane of the substrate 101 is represented by the X-Y plane of the Cartesian coordinate system shown, while a perpendicular to the plane of substrate lies along the Z-axis (Z-direction).

As further shown in FIG. 4A, the oxidizing ion beam 410 may be extracted when a voltage difference is applied using bias supply 420 between the plasma chamber 402 and substrate 101, or substrate platen 414, as in known systems. The bias supply 420 may be coupled to the process chamber 424, for example, where the process chamber 424 and substrate 101 are held at the same potential.

According to various embodiments, the oxidizing ion beam 410 may be extracted along the perpendicular 426 or may be extracted at a non-zero angle of incidence, shown as θ, with respect to the perpendicular 426.

The trajectories of ions within the oxidizing ion beam 410 may be mutually parallel to one another or may lie within a narrow angular range, such as within 10 degrees of one another or less. Thus, the value of θ may represent an average value of incidence angle where the individually trajectories vary up to several degrees from the average value. In various embodiments, the ion beam 410 may be extracted as a continuous beam or as a pulsed ion beam as in known systems. For example, the bias supply 420 may be configured to supply a voltage difference between plasma chamber 402 and process chamber 424, as a pulsed DC voltage, where the voltage, pulse frequency, and duty cycle of the pulsed voltage may be independently adjusted from one another.

In various embodiments, a suitable oxidizing gas, such as oxygen, may be supplied by the source 422 to plasma chamber 402. The plasma 404 may generate various oxidizing species, depending upon the exact composition of species provided to the plasma chamber 402.

In various embodiments, the oxidizing ion beam 410 may be provided as a ribbon ion beam having a long axis extending along the X-direction of the Cartesian coordinate system shown in FIG. 4B. By scanning a substrate platen 414 including substrate 101 with respect to the extraction aperture 408, and thus with respect to the oxidizing ion beam 410 along the scan direction 430, the oxidizing ion beam 410 may oxidize portions of the substrate 101.

In this example of FIG. 4B, the oxidizing ion beam 410 is provided as a ribbon ion beam extending to a beam width along the X-direction, where the beam width is adequate to expose an entire width of the substrate 101, even at the widest part along the X-direction. Exemplary beam widths may be in the range of 10 cm, 20 cm, 30 cm, or more while exemplary beam lengths along the Y-direction may be in the range of 2 mm, 3 mm, 5 mm, 10 mm, or 20 mm. A ratio of beam width to beam length may be in the range 5/1, 10/1, 20/1 50/1, or 100/1. The embodiments are not limited in this context.

Notably, the scan direction 430 may represent the scanning of substrate 101 in two opposing (180 degrees) directions along the Y-direction, or just a scan toward the left or a scan toward the right. As shown in FIG. 4B, the long axis of oxidizing ion beam 410 extends along the X-direction, perpendicularly to the scan direction 430. Accordingly, an entirety of the substrate 101 may be exposed to the oxidizing ion beam 410 when scanning of the substrate 101 takes place along a scan direction 430 to an adequate length from a left side to right side of substrate 101, as shown in FIG. 4B.

Turning now to FIG. 5A there is shown details of the implementation of anisotropic oxidation of a fin remnant in accordance with embodiments of the disclosure, using an oxidizing ion beam 410. The oxidizing ion beam 410 is provided as a ribbon beam having a long axis extending along the X-axis, as shown in FIG. 4B. In this example, the oxidizing ion beam 410 is directed so the trajectories of ions of the oxidizing ion beam 410 form a non-zero angle with respect to the perpendicular, shown as θ. As such, the ions of oxidizing ion beam 410 may be oriented so as to form a less grazing incidence angle with respect to the surface of the fin remnant. Depending upon the fin height, pitch, and height of cap layer 110 and mask 112, the appropriate value of q may be determined. For example, the value of θ may be determined so the oxidizing ion beam 410 may penetrate into trenches at least to the level of the isolation level 306, so as to oxidize any fin remnants protruding above the isolation level 306.

As examples, for an active fin height of 50 nm, meaning the active fin is to protrude 50 nm above the isolation level, and for a capping layer thickness of 30 nm, neglecting any mask thickness, the vertical distance along the Z-axis between isolation level 306 and top of fin array structure is 80 nm. For a 42-nm pitch, the angle with respect to horizontal $θ_h$ may be determined as arctan 80 nm/42 nm or 62 degrees; likewise for 32 nm pitch, $θ_h$ is 68 degrees, for 25 nm pitch, $θ_h$ is 73 degrees and so forth. The angle θ with respect to perpendicular is simply 90−$θ_h$, so for 42 nm pitch θ is 28 degrees, for 32 nm 22 degrees and for 25 nm 17 degrees. For deeper penetration of the oxidizing ion beam 410 into trench regions, the respective values of θ would be smaller. For wide fin cut regions where multiple fins may be removed in a trench, the values of θ may be much larger.

Figure 5B:
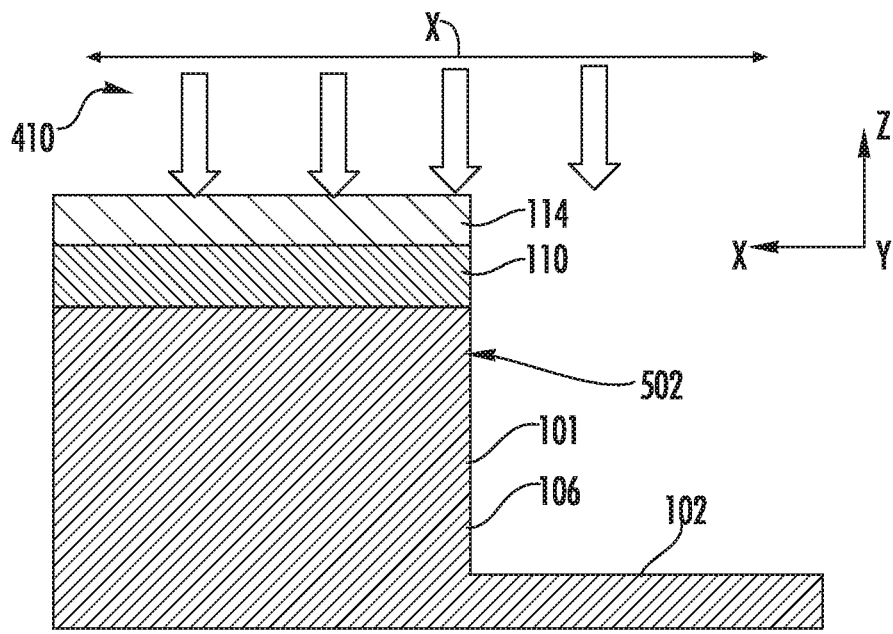

Turning to FIG. 5B, there is shown a cross-sectional view of the substrate 101 in the X-Z plane. Notably, while the oxidizing ion beam 410 has trajectories of ions forming a non-zero angle of incidence with respect to the perpendicular in 426 in the Y-Z plane, the trajectories are vertical as shown in the X-Z plane. Said differently, the oxidizing ion beam 410 forms a non-zero angle of incidence with respect to the X-Z plane, as shown in FIG. 5A, and is parallel to the Y-Z plane, as shown in FIG. 5B. This geometry advantageously avoids implanting oxidizing ions into the ends 502 of semiconductor fins 106. Thus, by appropriate alignment of an oxidizing ion beam in the shape of a ribbon beam, where the long axis of the ribbon beam is parallel to the long axis of the fins (such as along the X-axis), fin remnants may be oxidized while the protected segments of the fins (see first segments 212) are even better protected from loss.

Notably, while the view of FIG. 5A shows an ion beam directed to one sidewall of a trench, according to various embodiments, an ion beam may be directed to opposing sidewalls of a trench formed after a fin cut operation by rotating the substrate within the X-Y plane through a twist angle of 180 degrees about the Z-axis. Accordingly, a first exposure may be performed when the oxidizing ion beam 410 defines an angle of incidence θ as shown in FIG. 5A, to expose the sidewall 510. The substrate 101 may then be rotated 180 degrees so the oxidizing ion beam 410 strikes the sidewall 512.

Figure 6:
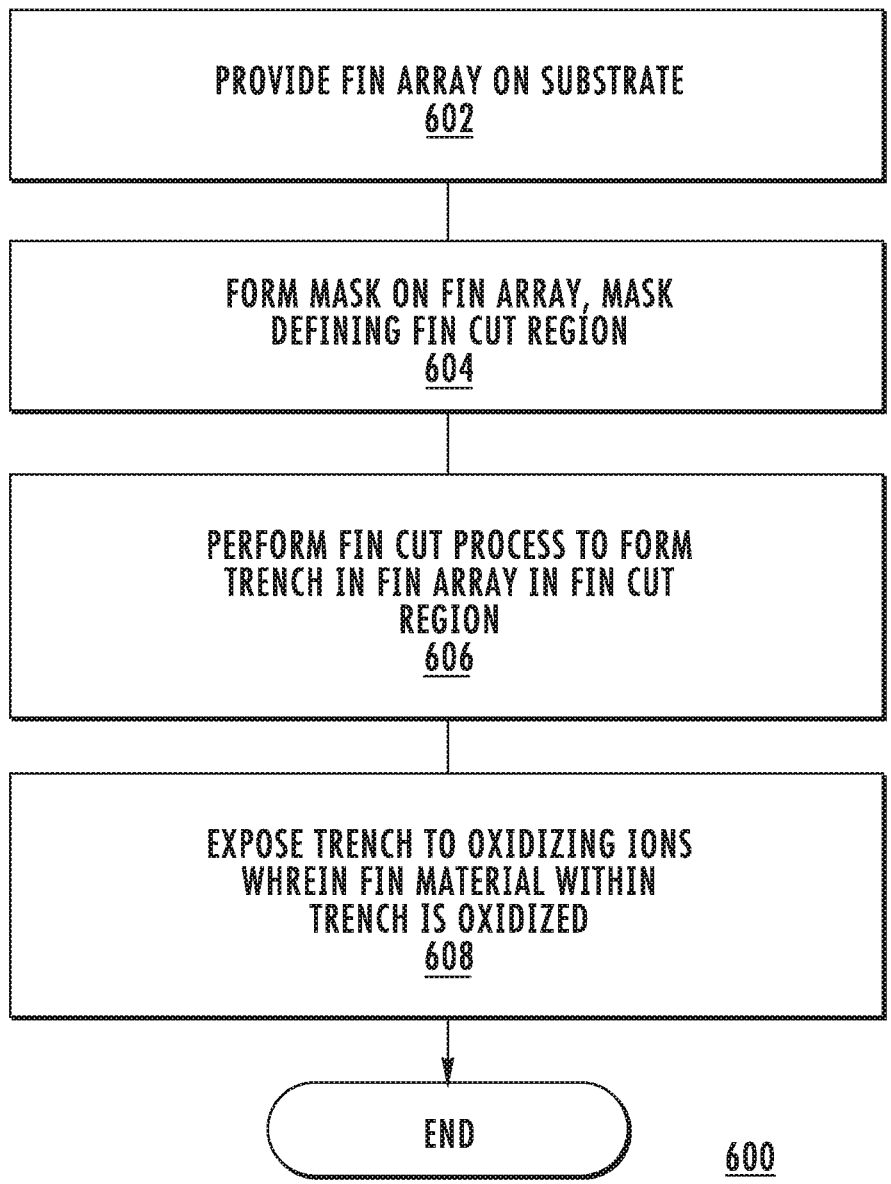
FIG. 6 shows a process flow, according to further embodiments of the disclosure.

FIG. 6 depicts an exemplary process flow 600, according to embodiments of the disclosure. At block 602, a fin array is provided on a semiconductor substrate, where the fin array may be an array of semiconductor fins, such as silicon fins, SiGe fins, composite Si/SiGe fins, and so forth. In some embodiments the pitch of fin array may be 100 nm or less, while the fin width W of the semiconductor fins may be 50 nm or less. In particular embodiments, the pitch may be 30 nm or less, while the fin width W is 15 nm or less.

At block 604, a mask is formed on the fin array, where the mask defines a fin cut region. The mask may be formed of photoresist or other mask material according to some embodiments. The fin cut region may define a portion of the fin array to be removed.

At block 606, a fin cut process is performed to form a trench in the fin array in the fin cut region. The fin cut process may employ known etch operations, such as reactive ion etching. As such, semiconductor fins or parts of semiconductor fins extending into the fin cut region, not protected by the mask may be etched. In some examples, the fin cut process may incompletely etch semiconductor fins or parts of semiconductor fins the mask is intended to expose.

At block 608, the trench is exposed to oxidizing ions, wherein fin material in the trench is oxidized. The fin material oxidized may include all or part of a fin remnant in the trench, for example. As such, semiconductor fins or portions of fins within the trench may be eliminated. In this process, the elimination of semiconductor fin remnants may occur, not by etching of the semiconductor material, instead by transformation of the semiconductor material to an insulator.

FIG. 7 depicts another exemplary process flow 700, according to other embodiments of the disclosure. At block 702, a fin array is generated on a semiconductor substrate, where the fin array may be an array of semiconductor fins. The semiconductor fins may be formed by patterning a monocrystalline semiconductor substrate base by etching a pattern of fins to be formed integrally with the monocrystalline semiconductor substrate base.

At block 704, an STI isolation layer is formed between the semiconductor fins of the fin array. The STI isolation may be formed according to known techniques.

At block 706, an anisotropic reactive ion etching operation is performed to generate a fin cut region in the fin array. The anisotropic reactive ion etching may be performed while a mask is disposed on the fin array to define an opening corresponding to the fin cut region. The fin cut region may define a trench extending from the mask surface to the substrate base at the bottom of the semiconductor fins. The trench may include at least one sidewall having a sidewall angle extending at a non-zero angle with respect to a vertical to the substrate base or plane of the substrate. As such, the trench may include at least one fin remnant, representing an incompletely etched semiconductor fin or portion of a fin in the fin cut region.

At block 708, the fin cut region, and in particular the trench is exposed to oxidizing ions using a room temperature plasma oxidation process. The plasma oxidation process may direct oxygen ions in an anisotropic implantation where the ion trajectories are more aligned along a perpendicular to the substrate plane than with the substrate plane. The fin remnants in the trench may present a surface forming a non-zero angle with respect to the perpendicular. As such, the oxygen ions may implant into the fin remnants, transforming the fin remnants, or portions of the fin remnants into insulator material.

At block 710, an STI deposition is performed to introduce insulator material such as oxide into the fin cut region, and in particular into the trench. As such, the STI deposition may cover semiconductor fins in the fin array.

At block 712, a fin reveal etch is performed, which etch may be selective to oxide, to remove STI material from top regions of semiconductor fins, forming active fin portions to be used in transistor devices of the fin array. As such, any portions of fin remnants not removed by plasma oxidation in the fin cut region may be submerged under the STI.

The present embodiments provide various advantages over known finFET processes. For one advantage, the loss of fin length incurred using known anisotropic RIE processing to remove fin remnants may be reduced or avoided using the anisotropic implantation approach of the present embodiments. For another advantage, the removal of fin remnants and the inadvertent oxidation of any fin ends at the edge of a mask may be carefully controlled because the oxidation is directly dependent on precisely controllable parameters, such as ion energy and ion flux. For a further advantage, the operations for an improved fin cut process are simplified with respect to known fin cut processes. As an example, the plasma oxidation approach does not entail pre-cleaning or fluorine residue post-cleaning associated with isotropic RIE removal of fin remnants.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method of forming a semiconductor device in a substrate, comprising:

providing a device structure, the device structure comprising a masked portion and a cut portion, the masked portion comprising a mask covering at least one semiconductor fin of a fin array, the cut portion comprising a trench, the trench exposing a semiconductor fin region of the fin array; and providing an exposure of the trench to oxidizing ions, the oxidizing ions to transform a semiconductor material within the trench into an oxide, wherein the oxidizing ions are directed as an ion beam having a shape of a ribbon beam to the substrate, the ion beam defining a trajectory forming a non-zero angle of incidence with respect to a perpendicular to a plane of the substrate;

wherein at least a portion of a semiconductor fin is present in the trench before the providing the exposure;

wherein a first portion of the semiconductor fin is oxidized during the exposure, and wherein a second portion of the semiconductor fin remains unoxidized; and wherein the oxidized first portion of the semiconductor fin is left in the trench to provide an insulator.

2. The method of claim 1, wherein the oxidizing ions comprise an ion energy of 500 eV to 10 keV.

3. The method of claim 1, wherein the fin array comprises a plurality of semiconductor fins, characterized by a fin width of 30 nm or less.

4. The method of claim 1, wherein the fin array comprises a plurality of semiconductor fins, having a lower portion comprising silicon, and an upper portion comprising a silicon:germanium alloy.

5. The method of claim 1, wherein the device structure comprises at least one truncated semiconductor fin of the fin array, the truncated semiconductor fin having a first segment, disposed underneath the mask, and a second segment, disposed in the trench, wherein, after the exposure, the second segment is oxidized, and wherein, after the exposure, the first segment is not altered.

6. A method for forming a finFET device, comprising
providing a fin array on a substrate, the fin array comprising a plurality of semiconductor fins, wherein the semiconductor fins are separated by an isolation oxide;

performing a fin cut operation on the fin array, wherein a trench is formed in the fin array, the trench including at least a portion of at least one fin of the fin array; and providing an exposure of the trench to oxidizing ions, wherein at least a first part of the semiconductor fin in the trench is oxidized, wherein the oxidizing ions are directed as an ion beam having a shape of a ribbon beam to the substrate, the ion beam defining a trajectory forming a non-zero angle of incidence with respect to a perpendicular to a plane of the substrate;

wherein a first portion of the semiconductor fin is oxidized during the exposure, and wherein a second portion of the semiconductor fin remains unoxidized; and wherein the oxidized first portion of the semiconductor fin is left in the trench to provide an insulator.

7. The method of claim 6, wherein the oxidizing ions comprise an ion energy of 500 eV to 10 keV.

8. The method of claim 6, wherein the fin array comprises a plurality of semiconductor fins, characterized by a fin width of 30 nm or less.

9. The method of claim 6, wherein the performing the fin cut operation comprises:

forming a mask over a first portion of the fin array, wherein a cut region is exposed; and etching at least one semiconductor fin in the cut region, wherein a portion of the at least one semiconductor fin in the cut region remains after the etching.

10. The method of claim 6, wherein the providing the exposure comprises oxidizing the semiconductor fin below an isolation level, the method further comprising: filling the trench with an insulator material to the isolation level.

11. A method for forming a finFET device, comprising
providing a fin array on a substrate, the fin array comprising a plurality of tapered semiconductor fins, wherein the tapered semiconductor fins are separated by an isolation oxide;

forming a mask on the fin array, the mask defining a fin cut region;

etching the fin array while the mask is in place to form a trench in the fin array in the fin cut region, wherein the trench extends from a surface of the mask to a bottom of the semiconductor fins; and performing a plasma oxidation of the fin array while the mask is in place, wherein oxidizing ions are implanted into the trench, wherein the oxidizing ions are directed as an ion beam having a shape of a ribbon beam to the substrate, the ion beam defining a trajectory forming a non-zero angle of incidence with respect to a perpendicular to a plane of the substrate;

wherein at least a portion of a semiconductor fin is present in the trench before the providing the plasma oxidation;

wherein a first portion of the semiconductor fin is oxidized during the plasma oxidation, and wherein a second portion of the semiconductor fin remains unoxidized; and wherein the oxidized first portion of the semiconductor fin is left in the trench to provide an insulator.

12. The method of claim 11, wherein the plasma oxidation comprises oxygen ions having an ion energy and an ion dose adequate to oxidize at least a 2-nm layer of silicon.

13. The method of claim 11, wherein the oxidizing ions comprise an ion energy of 500 eV to 10 keV.

* * * * *